United States Patent [19]

Davies

[11] Patent Number: 5,451,806
[45] Date of Patent: Sep. 19, 1995

[54] METHOD AND DEVICE FOR SENSING A SURFACE TEMPERATURE OF AN INSULATED GATE SEMICONDUCTOR DEVICE

[75] Inventor: Robert B. Davies, Tempe, Ariz.

[73] Assignee: Motorola, Inc., Schaumburg, Ill.

[21] Appl. No.: 205,238

[22] Filed: Mar. 3, 1994

[51] Int. Cl.$^6$ ............... H01L 23/56; H01L 29/66
[52] U.S. Cl. ..................... 257/370; 257/378; 257/467
[58] Field of Search .............. 257/467, 378, 370

[56] References Cited

U.S. PATENT DOCUMENTS

| | | | |
|---|---|---|---|
| 4,896,196 | 1/1990 | Blanchard et al. | 257/470 X |
| 4,903,106 | 2/1990 | Fukunaga et al. | 257/467 X |
| 5,100,829 | 3/1992 | Fay et al. | 437/60 |
| 5,237,481 | 8/1993 | Soo et al. | 257/467 X |
| 5,304,837 | 4/1994 | Hierold | 257/467 X |
| 5,349,336 | 9/1994 | Nishiura et al. | 257/467 X |

*Primary Examiner*—William Mintel
*Attorney, Agent, or Firm*—Rennie William Dover

[57] ABSTRACT

A temperature sensing insulated gate semiconductor device (10) and method of using the insulated the insulated gate semiconductor device (10) for sensing a surface temperature. A lateral PNP bipolar transistor (63) is connected to a drain conductor (58) of an insulated gate field effect transistor (56). The insulated gate field effect transistor (56) is turned on, thereby shorting a collector conductor (64) with a base conductor (62) to form a diode connected lateral PNP bipolar transistor (63). A forward voltage is measured across an emitter-base junction of the diode connected lateral PNP bipolar transistor (63). The surface temperature of the insulated gate semiconductor device (10) is derived using the diode equation in conjunction with the current (67) and the forward voltage drop.

15 Claims, 5 Drawing Sheets

METHOD AND DEVICE FOR SENSING A SURFACE TEMPERATURE OF AN INSULATED GATE SEMICONDUCTOR DEVICE

CROSS-REFERENCES TO RELATED APPLICATIONS

The present application is related to copending U.S. patent application Ser. No. 08/205,227, Attorney's Docket No. SC08556P, entitled "INSULATED GATE SEMICONDUCTOR DEVICE HAVING MASK MISALIGNMENT COMPENSATION AND METHOD OF FABRICATION" filed Mar. 3, 1994, by Robert B. Davies and assigned to the same assignee, Motorola, Inc.

The present application is further related to copending U.S. patent application Ser. No. 08/205,236, Attorney's Docket No. SC08538C, entitled "METHOD AND DEVICE FOR MONITORING CURRENT FLOWING IN AN INSULATED GATE SEMICONDUCTOR DEVICE" filed Mar. 3, 1994, by Robert B. Davies and assigned to the same assignee, Motorola, Inc.

The present invention relates, in general, to sensing the temperature of an integrated device, and more particularly, to a method and structure for sensing the surface temperature of an insulated gate semiconductor device.

BACKGROUND OF THE INVENTION

Semiconductor device manufacturers and users share a common concern for the amount of heat dissipated by a semiconductor device. Uncontrolled temperature increases at a semiconductor device P-N junction, i.e., high heat dissipation, may result in the device failing. One technique for measuring the temperature of a P-N junction exploits the relationship between current flowing through a forward biased P-N junction and the applied voltage across the P-N junction. More particularly, the current flowing through a forward biased P-N junction varies in accordance with the applied voltage across the P-N junction, the junction area, and the junction temperature. Thus, the forward voltage drop across a P-N junction, at a constant current, can be calibrated and used as a measure of the junction temperature.

In one approach, a polysilicon temperature sensing diode is formed in a polysilicon layer on a gate oxide region of a metal-oxide-semiconductor (MOSFET) transistor. The temperature of the sensing diode increases in response to an increase in the substrate temperature whereas the forward voltage drop across the sensing diode decreases. A drawback to this technique is the presence of a substantial thermal impedance, resulting from the oxide, between the temperature sensing diode and the semiconductor substrate. Further, the resistance of a polysilicon diode can vary, thereby adding variability to the forward voltage drop across the sensing diode.

Accordingly, it would be advantageous to have a new and novel method and means for sensing the temperature of an insulated gate semiconductor device, wherein the temperature sensing portion is integrated in the same mono-crystalline substrate as the insulated gate semiconductor device.

DETAILED DESCRIPTION OF THE DRAWINGS

Generally, the present invention provides a special purpose PNP bipolar transistor whose collector-base junction is shorted by an insulated gate semiconductor device. The gate, drain, and source electrodes of the insulated gate semiconductor device are respectively common with the insulated gate power semiconductor device's gate, drain, and source electrodes whose on-state temperature is to be monitored. More particularly, the semiconductor device of the present invention is fabricated to permit the measurement of the surface temperature of an insulated gate semiconductor power device. This is accomplished by coupling the PNP transistor base and collector terminals to the drain and source terminals of an insulated gate field effect transistor, respectively, and applying a voltage between the gate terminal and the source terminal ($V_{GS}$) of the insulated gate field effect transistor. At a sufficient $V_{GS}$, a channel is formed in the insulated gate field effect transistor which shorts a collector terminal of the PNP transistor with its base terminal. A current is driven into an emitter terminal of the diode connected PNP transistor and exits via the shorted base and collector terminals. Subsequently, a voltage drop across the PNP diode connected transistor is measured, and the voltage-current relationship of the PNP bipolar transistor is used to derive a surface temperature of the co-integrated insulated gate semiconductor power device.

Figure 1:
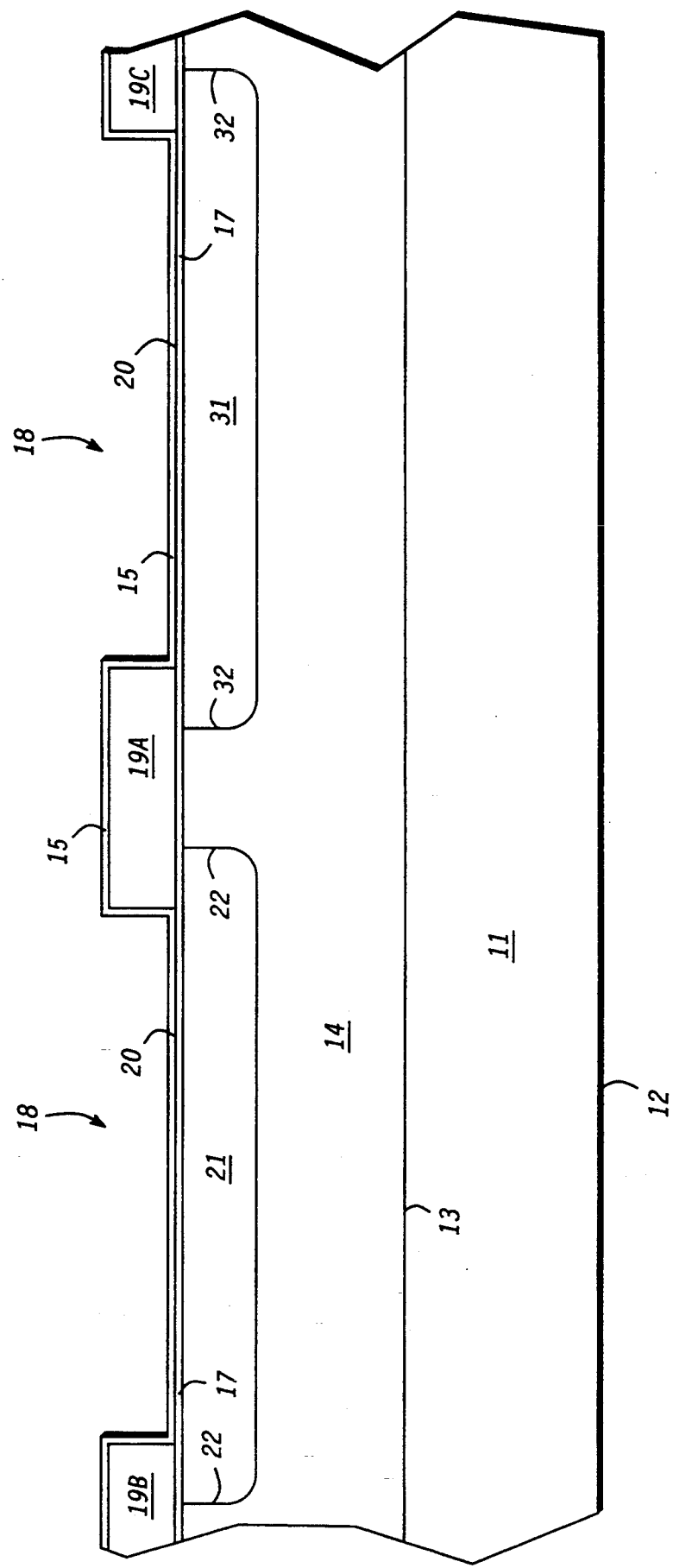
FIGS. 1-4 illustrate enlarged cross-sectional views of a temperature sensing device in accordance with an embodiment of the present invention.

FIG. 1 illustrates an enlarged cross-sectional view of a partially completed insulated gate integrated device 10 in accordance with an embodiment of the present invention. The insulated gate integrated device 10 comprises a substrate layer 11 having major surfaces 12 and 13. In a first embodiment, the substrate layer 11 is monocrystalline silicon of N conductivity type and having a resistivity ranging between approximately 0.001 ohm-centimeter ($\Omega$-cm) and approximately 0.02 $\Omega$-cm. In a second embodiment, the substrate layer 11 is monocrystalline silicon of P conductivity type and having a resistivity ranging between approximately 0.001 $\Omega$-cm and approximately 0.02 $\Omega$-cm. As those skilled in the art are aware, the insulated gate integrated device 10 will be an insulated gate field effect transistor (IGFET) or device when the substrate layer 11 is of N conductivity type, and an insulated gate bipolar transistor (IGBT) when the substrate layer 11 is of P conductivity type.

An epitaxial silicon layer 14 having a major surface 16 is formed on the major surface 13. Preferably, the epitaxial layer 14 is of N conductivity type. Methods of forming the epitaxial layer 14 are well known to those skilled in the art. Preferably, the impurity material concentration of the epitaxial layer 14 ranges between approximately 0.2 $\Omega$-cm and approximately 400 $\Omega$-cm. The epitaxial layer 14 serves as a drift region or a voltage supporting region for the device and will have a thickness and a resistivity to meet desired device specifications.

A conformal layer of gate oxide 17 is formed on the major surface 16. A suitable range of thicknesses for the layer of gate oxide 17 is between approximately 200 angstroms and 1,200 angstroms. By way of example, the layer of gate oxide has a thickness of 800 angstroms. An 800 angstrom thick gate oxide provides a threshold voltage ranging between approximately 2 and 4 volts for an N-channel device. A conformal layer of polysilicon (not shown) is formed on the conformal layer of gate oxide 17. A suitable range of thicknesses for the layer of polysilicon is between approximately 3,000 angstroms and approximately 7,000 angstroms. Methods of forming gate oxide layers and polysilicon layers are well known to those skilled in the art.

Using well known techniques, the layer of polysilicon is patterned to form polysilicon gate structures 19A, 19B, and 19C, which are also referred to as polysilicon gates or simply gates. More particularly, holes 18 are anisotropically etched in the layer of polysilicon to form the polysilicon gate structures 19A, 19B, and 19C. The holes or windows 18 expose portions of the gate oxide layer 17. The exposed portions of the gate oxide 17 serve as a pre-implant oxide 20 to protect the epitaxial layer 14 during subsequent implant steps.

As illustrated in FIG. 1, a thin oxide layer 15 of approximately two hundred angstroms thickness is formed on the polysilicon gates 19A, 19B, and 19C to protect them during subsequent processing steps. It shall be understood that during the formation of the thin oxide layer 15, a slight increase in the thickness of the exposed portions of the gate oxide 17 occurs, and that the formation of the thin oxide layer is optional. The thin layer of oxide 15 may be thermally grown or conformally deposited. To simplify the description of the present invention, the thin oxide layer 15 on the exposed portions of the gate oxide 17 and the exposed portions of the gate oxide 17 are collectively referred to as the pre-implant oxide 20.

An impurity material of P conductivity type is implanted through the pre-implant oxide 20, wherein the polysilicon gates 19A, 19B, and 19C serve as masks. After the implant, an anneal is performed thereby diffusing the impurity material into the epitaxial layer 14. The impurity material forms dopant wells 21 and 31 having sidewalls 22 and 32, respectively. The dopant wells 21 and 31 are also referred to as body regions. Preferably, the dopant wells 21 and 31 extend approximately 1.0 to approximately 2.5 microns into the epitaxial layer 14 from the major surface 16. It is further preferred that the impurity material of P conductivity type be boron having a surface concentration ranging from approximately $3 \times 10^{16}$ atoms per cubic centimeter (atoms/cm$^3$) to approximately $3 \times 10^{17}$ atoms/cm$^3$. It shall be understood that the same reference numerals are used in the figures to denote the same elements.

Figure 2:
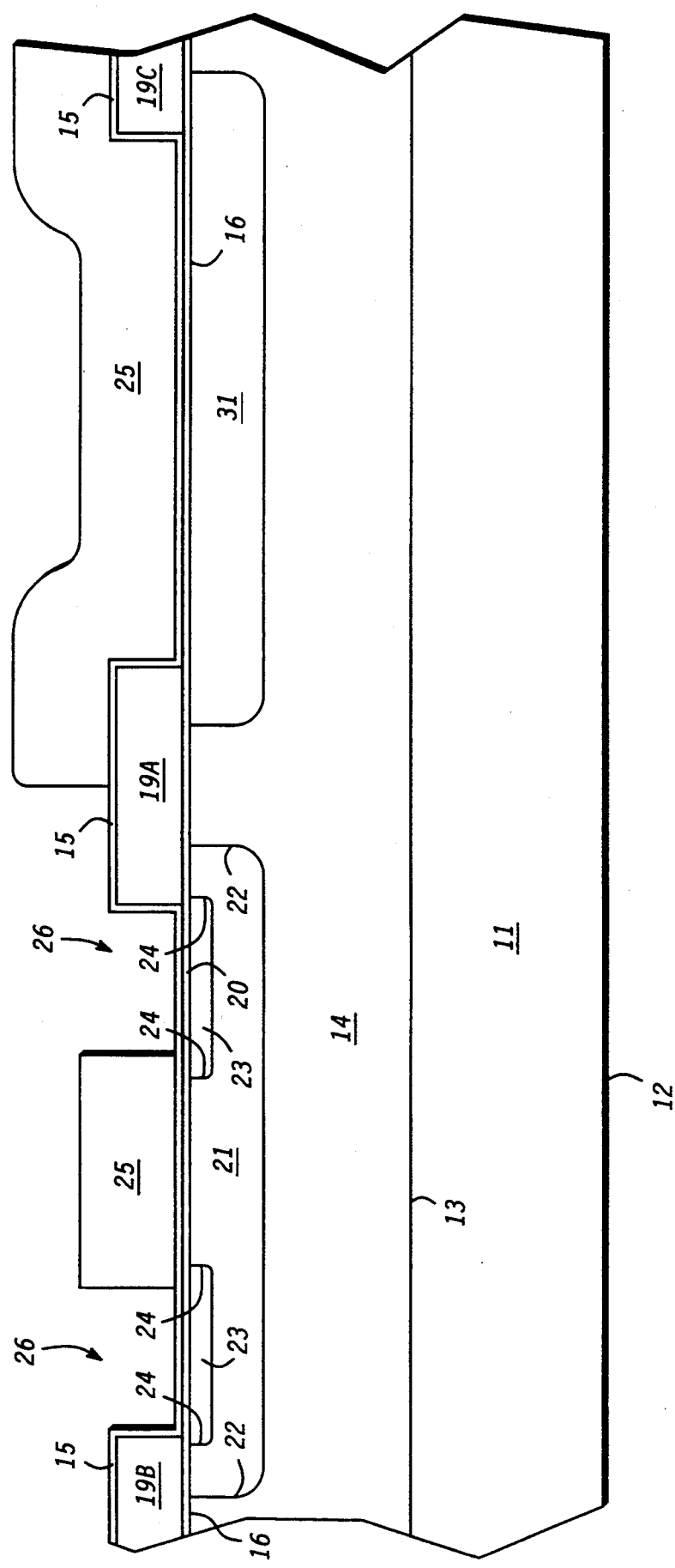

Now referring to FIG. 2, the polysilicon gates 19A, 19B, and 19C and the pre-implant oxide 20 are coated or covered with a layer of photoresist 25. Openings 26 are formed in the layer of photoresist 25 to expose a portion of the pre-implant oxide 20 adjacent each side of polysilicon gates 19A, 19B, and 19C. The patterned layer of photoresist 25 serves as an implant mask. Accordingly, an impurity material of N conductivity type is implanted through the openings 26 and into the portions of the body region 21 below the exposed portions of the pre-implant oxide 20. The patterned layer of photoresist 25 is removed and an anneal is performed. The anneal repairs the silicon lattice structure in the body region 21 and diffuses the implanted impurity material into the body region 21, i.e., the anneal activates the implanted impurity ions.

The impurity material and the subsequent activation of the impurity material forms dopant or source regions 23 having sidewalls 24. Preferably, the source regions 23 extend approximately 0.15 to approximately 0.5 microns into the dopant region 21, from the major surface 16. It is further preferred that the impurity material of N conductivity type be arsenic having a surface concentration ranging from approximately $3 \times 10^{20}$ atoms/cm$^3$ to approximately $3 \times 10^{21}$ atoms/cm$^3$. Methods of coating, patterning, and removing layers of photoresist are well known to those skilled in the art.

Figure 3:
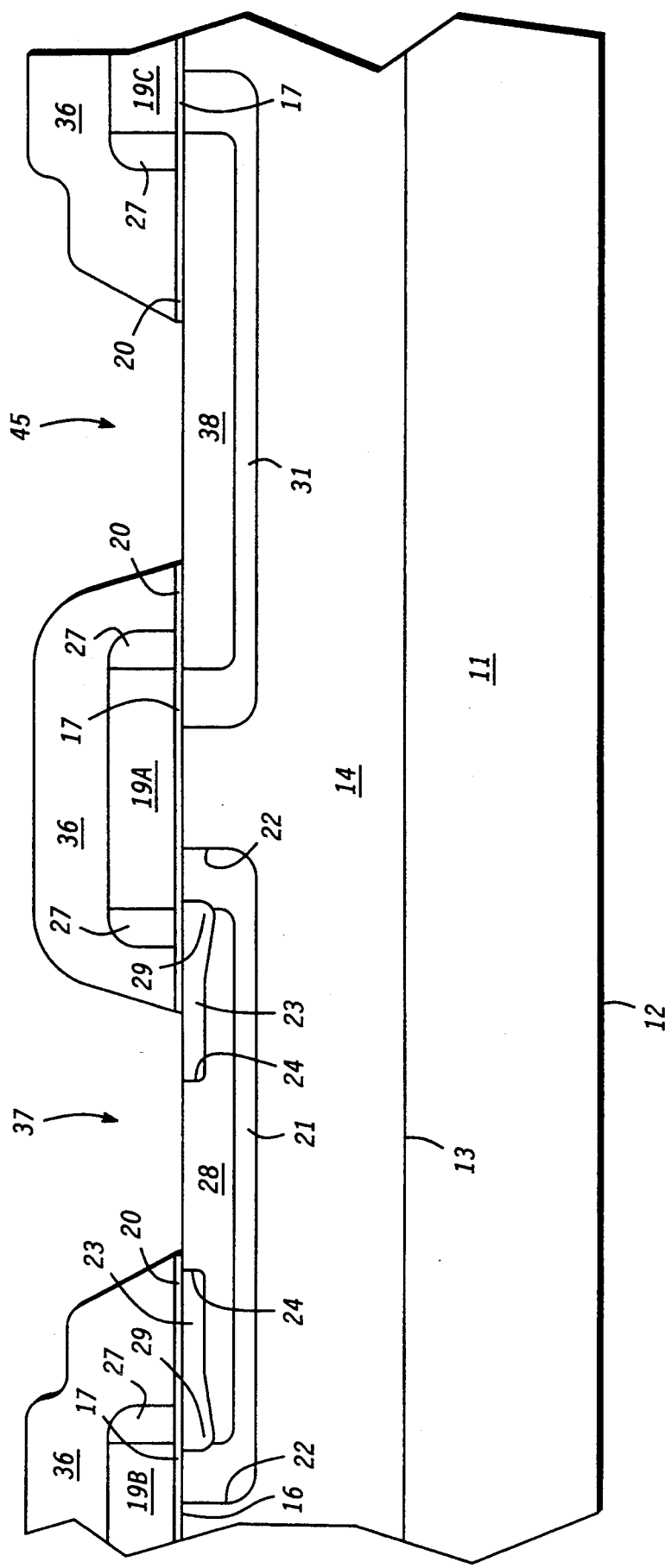

Now referring to FIG. 3, a layer of dielectric material (not shown) is conformally deposited over the polysilicon gates 19A, 19B, and 19C and the pre-implant oxide 20. Subsequently, sidewall spacers 27 are formed adjacent each sidewall of the polysilicon gates 19A, 19B, and 19C by anisotropically etching the layer of dielectric material. Techniques for anisotropically etching layers of dielectric material are well known to those skilled in the art.

The anisotropic etching of the conformal layer of dielectric material uncovers the portion of the pre-implant oxide 20 between the sidewall spacers 27. An impurity material of P conductivity type (i.e., the same conductivity type used, to form the body regions 21 and 31) is implanted through the uncovered portions of the pre-implant oxide 20 into the dopant wells 21 and 31. The base regions 28 and 38 are formed in the base wells 21 and 31, respectively, by activating the implanted impurity material. Further, the base regions 28 and 38 are formed underneath the source regions 23, by activating the implanted impurity material. The base regions 28 and 38 are also referred to as low resistance regions.

The sidewall spacers 27 serve as an implant mask to the ion implantation, and results in the formation of trough regions 29 within the base region 28. It shall be understood that the impurity material is implanted with sufficient energy so that only an insignificant portion of the implanted impurity material remains in the source regions 23. In other words, the implanted impurity material is implanted with sufficient energy so that the resistivity and conductivity type of the source regions 23 remain substantially unchanged.

An oxide layer 36 is conformally deposited on the polysilicon gates 19A, 19B, and 19C, oxide spacers 27, and the pre-implant oxide 20. A source/emitter opening 37 is formed in the oxide layer 36 and the pre-implant oxide 20 to expose a portion of the source region 23 and the adjacent base region 28. An emitter opening 45 is formed in the oxide layer 36 and the pre-implant oxide 20 to expose a portion of the base region 38. By way of example, the oxide layer 36 and the pre-implant 20 are anisotropically etched to form the openings 37 and 45. The oxide layer 36 may be partially wet etched resulting in a sloped sidewall as shown in FIG. 3.

Figure 4:
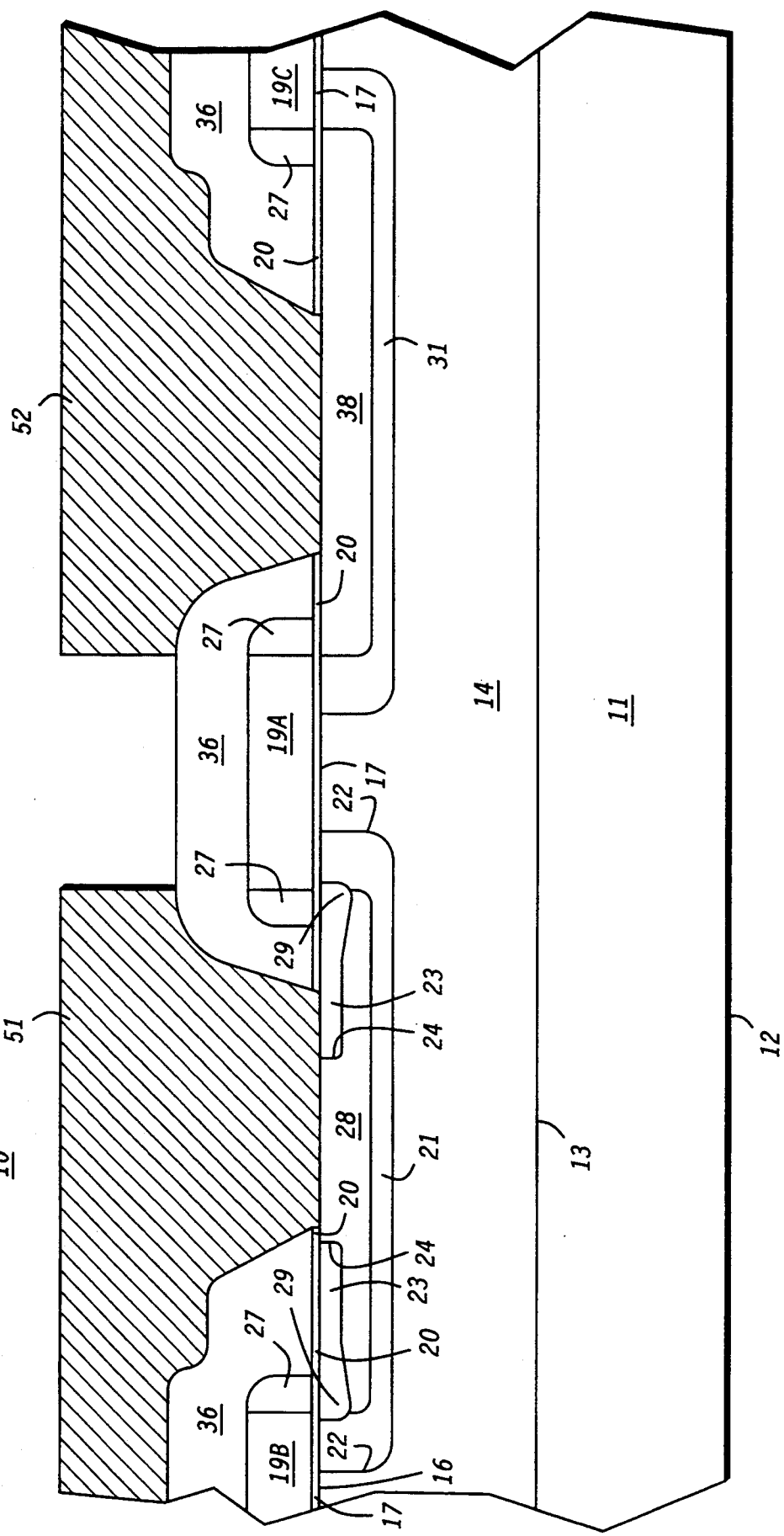

Now referring to FIG. 4, a source/emitter electrode 51 is formed in the source/emitter opening 37. An emitter electrode is formed in the emitter opening 45. More particularly, the source/emitter electrode 51 electrically couples the source regions 23 and the base region 28. By way of example, the source/emitter electrode 51 is coupled to a Kelvin pad (not shown). In addition, an emitter electrode 52 is formed in the emitter opening 45.

Figure 5:
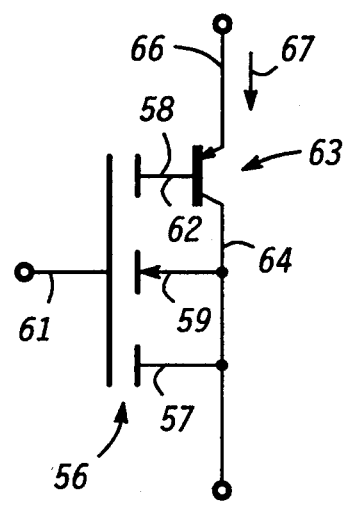
FIG. 5 illustrates a circuit schematic of the temperature sensing device of FIGS. 1-4 in accordance with an embodiment of the present invention.

FIG. 5 illustrates a circuit schematic of the special purpose combined PNP bipolar transistor/insulated gate transistor temperature sensing device described with reference to FIGS. 1-4. The special purpose combined PNP bipolar transistor/insulated gate transistor temperature sensing device 10 comprises an insulated gate field effect transistor 56 having a source conductor 57, a drain conductor 58, and a body conductor 59. In accordance with FIGS. 1-4, the polysilicon gate 19A is illustrated in FIG. 5 as the gate conductor 61.

The drain conductor 58 is connected to a base conductor 62 of a PNP bipolar transistor 63. The source conductor 57 is connected to body conductor 59 and to the collector conductor 64. In addition, the PNP bipolar transistor 63 has an emitter conductor 66.

In operation, a positive charge is applied to the gate conductor 61 rendering insulated gate transistor 61 operative. The current path between the source conductor 57 and the drain conductor 58, i.e., between the source region 23 and the epitaxial layer 14, shorts the base conductor 62 with the collector conductor 64, thereby configuring the PNP bipolar transistor 63 to be a diode connected PNP bipolar transistor.

A current indicated by the arrow 67 is forced into the emitter electrode 66. The current 67 flows through diode connected PNP bipolar transistor 63, with base current flowing through insulated gate field effect transistor 56, and exits transistor 56 via the source conductor 57.

The voltage drop across the forward conducting diode connected PNP bipolar transistor is measured and in conjunction with the current flowing through the diode connected PNP bipolar transistor is used to derive the surface temperature of the insulated gate semiconductor device 10.

By now it should be appreciated that an improved method and means for sensing the surface temperature of insulated gate semiconductor devices has been provided. The insulated gate field effect transistor is turned on by applying an appropriate gate-source voltage $V_{GS}$. In other words, a channel region is created that converts the PNP bipolar transistor into a diode connected PNP transistor. The forward voltage drop ($V_F$) across the base-emitter junction is measured. Using the diode equation in conjunction with the values of $V_F$ and the current flowing through the diode connected PNP bipolar transistor, the surface temperature of the PNP bipolar transistor is determined. One advantage of the method of the present invention is that the surface temperature is derived using monocrystalline silicon which has less variability in resistance than does polysilicon. Accordingly, the forward voltage drop, $V_F$, in the monocrystalline silicon has a greater uniformity than that of polysilicon. Another advantage is that the PNP bipolar transistor of the present invention has a current gain. Further, the diode of the present invention has less leakage current than polysilicon diodes.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, the diode connected bipolar transistor is a PNP when the insulated gate semiconductor power device is an N-channel device. Correspondingly, when the insulated gate semiconductor power device is a P-channel device, the diode connected bipolar transistor is an NPN.

I claim:

1. An integrated device for sensing a surface temperature of an insulated gate semiconductor device, comprising:
    a metal-oxide-semiconductor device having a drain region, a source region, a body region, and a gate structure; and
    a bipolar transistor for detecting a temperature of the metal-oxide-semiconductor device, the bipolar transistor having an emitter region, a base region, and a collector region, wherein the collector region and the body region are common regions and the base region and the drain region are common regions.

2. The integrated device of claim 1, wherein the metal-oxide-semiconductor device is an n-channel device.

3. The integrated device of claim 2, wherein the bipolar transistor is a PNP bipolar transistor.

4. The integrated device of claim 1, wherein the bipolar transistor is a lateral PNP bipolar transistor.

5. The integrated device of claim 1, wherein the source region is electrically coupled to the body region.

6. An integrated device for sensing a surface temperature of an insulated gate semiconductor device, comprising:
    a semiconductor material of a first conductivity type having a first major surface and a second major surface;
    at least two dopant wells of a second conductivity type and a first dopant concentration, the at least two dopant wells extending from the first major surface a first distance into the semiconductor material and each having at least first and second sidewalls;
    a low resistance region of the second conductivity type and a second dopant concentration and having first and second sidewalls extending a second distance into each of the at least two dopant wells, and the first and second sidewalls of the first low resistance region are adjacent to and spaced apart from the first and second sidewalls of the first dopant well, respectively;
    a dopant region of the first conductivity type having at least first and second sidewalls, wherein the dopant region extends from the major surface into the low resistance region a third distance, the dopant region overlapping the first sidewall of the low resistance region, the first sidewall of the first dopant region being in one of the at least two dopant wells;
    a layer of gate oxide disposed on at least a portion of the major surface of the one dopant well between the first sidewall of the one dopant well and the first sidewall of the dopant region in the one dopant well;
    a gate electrode disposed on the layer of gate oxide;
    a first electrode simultaneously contacting a portion of the first dopant region and a portion of the first low resistance region; and
    a second electrode contacting a second dopant well of the at least two dopant wells.

7. The integrated device of claim 6, wherein the semiconductor material of a first conductivity type is an epitaxial layer disposed on a semiconductor substrate of the first conductivity type.

8. The integrated device of claim 6, wherein the first conductivity type is N conductivity type, the second conductivity type is P conductivity type, and the gate electrode is polysilicon of N conductivity type.

9. The integrated device of claim 6, wherein the first distance is greater than the second distance and the second distance is greater than the third distance.

10. The integrated device of claim 6, wherein the portion of the one dopant well between the first sidewall of the one dopant well and the first sidewall of the dopant region serves as a channel region, the first electrode serves as an collector electrode, and the second electrode serves as an emitter electrode.

11. An integrated device for sensing a surface temperature of an insulated gate semiconductor power device, comprising:

a semiconductor substrate of a first conductivity type and having a first major surface and a second major surface;

an epitaxial layer disposed on the first major surface, the epitaxial layer having a principal surface and being of a second conductivity type;

first and second dopant wells of the first conductivity type, wherein the first and second dopant wells extend from the principal surface into the epitaxial layer a first distance and have a first lateral boundary;

a base region within each dopant well, wherein the base region of each dopant well is of the first conductivity type, extends from the principal surface into a respective dopant well a second distance, and has a second lateral boundary spaced apart from the first lateral boundary;

a source region having a portion overlapping the base region in the first dopant well, wherein the source region is of the second conductivity type and extends from the principal surface into the first base region a third distance;

a layer of dielectric material on the principal surface over and between portions of the first and second dopant wells;

a gate electrode disposed on the layer of dielectric material;

a collector electrode simultaneously contacting a portion of the source region and the base region of the first dopant well; and an emitter electrode contacting the second major surface of the second dopant well.

12. The semiconductor device of claim 11, including an insulated gate semiconductor device comprising a drain region, a source region, and a body region and a bipolar transistor having a collector region, a base region, and an emitter region, wherein the portion of the epitaxial layer between the first and second dopant wells serves as the drain region and the base region, the body region and the collector region are common regions between the insulated gate semiconductor device and the bipolar transistor, and the source region is electrically coupled to the body region.

13. The semiconductor device of claim 11, wherein the layer of conductive material disposed on the layer of dielectric material is polysilicon doped with an impurity material of the second conductivity type.

14. A method of sensing a surface temperature of an insulated gate semiconductor device, comprising the steps of:

forcing a firsts current through an emitter electrode of a diode connected PNP bipolar transistor;

directing the first current through a drain region of the insulated gate semiconductor device, the drain region comprised of a monocrystalline semiconductor material and serving as a base region of the diode connected PNP bipolar transistor;

collecting a portion of the first current at the collector of the diode connected PNP bipolar transistor, the collector of the diode connected PNP bipolar transistor being common with a body of the insulated gate semiconductor device and electrically coupled to a source of the insulated gate semiconductor device, and a base of the diode connected PNP bipolar transistor being common with the drain of the insulated gate semiconductor device; and measuring the voltage between the emitter electrode of the diode connected PNP bipolar transistor and the source of the insulated gate semiconductor device.

15. The method of claim 14, wherein the diode connected PNP bipolar transistor is a lateral PNP bipolar transistor.

* * * * *